United States Patent [19]
Lawrence

[11] 3,923,567
[45] Dec. 2, 1975

[54] METHOD OF RECLAIMING A SEMICONDUCTOR WAFER

[75] Inventor: John E. Lawrence, Cupertino, Calif.

[73] Assignee: Silicon Materials, Inc., Mountain View, Calif.

[22] Filed: Aug. 9, 1974

[21] Appl. No.: 496,072

[52] U.S. Cl. ...................... 156/7; 29/575; 148/191; 156/17; 156/20; 156/345; 252/79.3; 252/79.4
[51] Int. Cl.$^2$ .......................................... H01L 7/50
[58] Field of Search ............. 148/191; 156/6, 7, 17, 156/345; 252/79.3, 79.4; 29/575

[56] References Cited

UNITED STATES PATENTS

| | | | |
|---|---|---|---|
| 3,556,879 | 1/1971 | Mayer | 148/191 |
| 3,559,281 | 2/1971 | Mayberry et al. | 29/575 |
| 3,701,696 | 10/1972 | Mets | 117/212 X |
| 3,811,975 | 5/1974 | VanLierop et al. | 156/17 X |
| 3,869,313 | 4/1975 | Jones et al. | 134/73 |

OTHER PUBLICATIONS

IBM Technical Disclosure Bulletin, Vol. 15, No. 8, Jan. 1973, p. 2358, Process For Removing Wafer Surface Contaminants by S. E. Greer and M. S. Pak.

*Primary Examiner*—William A. Powell
*Attorney, Agent, or Firm*—Schatzel & Hamrick

[57] ABSTRACT

A method of reclaiming a semiconductor wafer wherein wafers which have been rejected due to electrical failures or visual defects can be processed to form a purer wafer capable of providing above average yields. The method comprises the steps of gettering to draw undesired point defects (impurities and vacancies) toward the wafer surface and chemical etching to remove most of the point defects whose presence in silicon would lower semiconductor yields. Other steps include grinding the back surface of the wafer to form an insitu getter region and finally polishing the front of the wafer to form a strain-free mirror-like finish.

11 Claims, 5 Drawing Figures

METHOD OF RECLAIMING A SEMICONDUCTOR WAFER

BACKGROUND OF THE INVENTION

1. Field of the Invention

This invention relates generally to a method of reclaiming semiconductor wafers and more particularly to the application of gettering and etching processes prior to device fabrication, so as to effectively remove impurities which were not intentionally incorporated into the as-grown crystal.

2. Description of the Prior Art

The semiconductor circuit manufacturers in the United States require approximately 1,000,000 silicon wafers each week in 1974. The demand for silicon wafers is likely to grow by an average of 20% annually through 1980. The supply of high purity polycrystalline silicon in 1973 and early 1974 was not adequate to satisfy the demand for wafers. This shortage of "poly-si" contributed directly to wafer shortages and loss in potential revenue by semiconductor circuit manufacturers. The increase in demand for silicon wafers is forecasted to exceed the availability of polycrystalline silicon through much of the remainder of this decade. High quality wafers from sources other than polycrystalline stock have to be developed. Silicon wafer reclamation by an advanced state of the art procedure is the answer.

The semiconductor circuit manufacturers will ship products from about 50% of the silicon wafers used in a circuit fabrication line. The wafers which do not contain shippable products can be classified as process monitor test wafers or circuit wafers which have gross circuit problems from furnaces, photo pattern printing, or deposition systems. Of the nearly 500,000 silicon wafers not having shippable products each week, approximately 300,000 are reclaimable. Only wafers which are broken, warped, too thin, or contain gold are not reclaimable.

The most simple and least expensive means of reclaiming silicon consists of only mechanically or chem-mechanically polishing the front wafer surface. However, mere polishing processes do not remove contamination on the back surface of the wafer, contaminant impurities in the bulk wafer, and occasionally dopant diffused impurities in the frontside of the wafer when inadequate material is polished off.

Another example of a wafer reclaim process may be found in U.S. Pat. No. 3,559,281, entitled "Method of Reclaiming Processed Semiconductor Wafers" by B. A. Mayberry et al, issued Feb. 2, 1971. This patent teaches a process for reclaiming wafers having an epitaxial layer formed on one wafer surface and includes the step of first removing all conducting and insulating layers from the wafer. A passivation layer is then formed on the wafer. The passivation layer is removed from the back wafer surface. The back surface is then polished to a mirror-like finish and used as the substrate for new circuit fabrication. However, this process leaves contaminant impurities on the original circuit side of the wafer and in the bulk wafer.

Semiconductor product failure can often be traced directly to contamination which was once in the bulk or surface lattice. Consequently, an effective wafer reclaim process must include steps which will extract or remove impurities not intentionally grown into the original crystal ingot.

The outer portions of silicon wafers contain lattice imperfections and impurities (dopant and contaminant) which are deliterious to the performance of semiconductor products formed in reclaim wafers.

Dopant impurities, usually boron, phosphorus, arsenic or antimony, are introduced into the silicon surface by (1) thermal diffusion, (2) ion implantation, or (3) epitaxial deposition. The dopant type, concentration, and location of these impurities will establish the electrical performance of the semiconductor product. The formation of a new semiconductor product in a reclaimed wafer requires the removal of all dopant impurities not present in the as-grown crystal. Contaminant impurities introduced into silicon wafers will mainly be restricted to the lattice near the wafer surface. This is due to the usually slow bulk diffusivity of contaminant impurities in silicon. These undesired impurities usually have a low solubility limit in silicon, thus contributing to large concentrations of contaminant impurities on the wafer surfaces and in regions of lattice imperfections near the wafer surface.

As is the case for both MOS and bipolar device structures usually less than 10% of a wafer is occupied by surface lattice imperfections and impurities of type or concentration not present in the as-sawed silicon wafer. These outer portions of the wafer must be removed since the "surface" lattice imperfections may provide a nucleation site for the segregation of impurities in the silicon lattice. Such impurity segregation can contribute to excessive leakage current in P/N junctions and semiconductor device failure. Lattice imperfections near the wafer surface are a result of (1) excess point defects grown into a silicon crystal, (2) lattice strain from diffused solute impurities, (3) ion implantation, or (4) lattice deformation from mechanical polishing.

The favorable application of this invention is to totally remove the outer portions of silicon wafers which contain essentially all of the surface lattice imperfections, dopant impurities, and contaminants not present in the as-sawed silicon wafer.

A less thorough, but valuable application of this invention is to partially remove this undesired outer portion of silicon but leave some diffused dopant impurities. This option may be selected if the diffused dopants extend deep into a thin wafer. Caution will have to be taken to assure the subsequent front (or device) wafer side mechanical or chemical-mechanical polish step removes the remaining undesirable portion of the silicon wafer.

This invention employs a low temperature phosphorus gettering step which reduces the concentration of point defects (vacancies and contaminant impurities) in silicon wafers to levels very often less than those concentrations grown into the original crystal-ingot.

"Excess vacancies" in silicon wafers are the quantity difference between the concentration grown into the ingot at the melt temperature (approximately 1340°C) and the solubility limit at temperatures near 1050°C or the normal semiconductor product fabrication temperature. Excess vacancies must annihilate if a silicon wafer is to be at equilibrium during the fabrication of a semiconductor product. Such annihilation occurs by excess vacancies diffusing to the wafer surface or by vacancies combining with other crystal lattice imperfections. In dislocation-free silicon, excess vacancies often combine with one another to form vacancy clusters. The portion of silicon nearest the wafer surface often becomes highly disordered due to vacancy annihilation when the silicon wafer, with excess vacancies, is introduced to its initial furnace treatment. The disordered surface lattice will contribute to poor semiconductor product electrical characteristics by reducing minority carrier lifetime. A secondary semiconductor product failure mode will likely develop due to the Cottrell capture of impurities by the surface lattice defects. The formation of contaminant impurity segregates at surface lattice imperfections can cause poor semiconductor product electrical characteristics by increasing P/N junction reverse currents and by providing current leakage paths between the emitter and collector of bipolar transistors. Silicon wafers treated by the getter step in accordance with this invention will be virtually free of excess vacancies and their associated surface lattice disorders prior to the wafer's introduction to unique semiconductor product fabrication.

Contaminant impurities in silicon are those atoms in the lattice other than silicon and the intentionally introduced dopant such as B, P, Sb, or As. All contaminant impurities in silicon are undesirable because they can influence the physical, chemical and electrical properties of silicon crystals. Particularly harmful to the semiconductor characteristics of products in silicon are contaminant impurities with concentrations above their solubility limits at the temperatures used to fabricate the product, near 1050°C. Such excess contaminant impurities must annihilate if the crystal is to achieve equilibrium. Impurity annihilation occurs by diffusion to the wafer surface, Cottrell capture with lattice imperfections, or by impurity – impurity precipitation. The electrical characteristics of semiconductor products will degrade from the results of each of these three forms of excess contaminant impurity annihilation. An increase in semiconductor leakage current is the most common form of semiconductor device degradation introduced by excess concentrations of contaminant impurities. Silicon wafers treated by this getter step will be virtually free of excess concentrations of contaminant impurities. The phosphorus getter furnace treatment used in this invention provides a temperature near that used in device fabrication for contaminant impurity mobility. In this invention the formation of a shallow diffused layer containing a high concentration of phosphorus attracts contaminant impurities by providing fresh nucleation sites for Cottrell capture and phosphorus for an impurity – impurity interaction. In addition, the use of a chemical etch to remove the getter phosphorus diffused layer leaves a silicon lattice substantially free of contaminant impurities which could degrade semiconductor product electrical characteristics.

A prior art reference relative to the gettering operation is an article by J. E. Lawrence, entitled "Metallographic Analysis of Gettered Silicon", Transactions of the Metallurgical society of AIME, Vo. 242, March 1968, pp. 484–489. Also see the article by J. E. Lawrence, entitled "The Case For Reclaim Wafers", Electronic Packaging and Production, January 1974, pp. 66–78.

SUMMARY OF THE PRESENT INVENTION

It is an object of the present invention to provide a process for reclaiming semiconductor wafers which removes from a wafer point defects (impurities and vacancies) that would degrade the performance characteristics of semiconductor devices fabricated in the wafer.

Another object of the present invention is to provide a semiconductor reclaiming process in which the undesired portions are removed from the front and the back faces of the wafers in a manner which is not affected by variations in wafer thickness.

In accordance with this invention, a process of reclaiming a semiconductor wafer by extracting unwanted point defects prior to the processing steps which contribute to the fabrication of unique semiconductor devices is disclosed. The process comprises the steps of stripping all external conducting and insulating layers from the wafer, gettering the wafer so as to draw excess point defects toward the surface of the wafer, and etching the surface of the wafer so as to effectively remove the unwanted impurities and surface lattice imperfections from the wafer prior to reclamation. In addition, in the preferred embodiment, the back face of the wafer is ground so as to generate a massive source of surface lattice strain and the front face of the wafer is polished to form a strain-free, mirror-like finish.

The getter step employs a furnace temperature of 1040°±50°C and a functionally infinite source of phosphorus for diffusion to maximize purifying effectiveness. The furnace temperature is selected at or slightly below the normal semiconductor device fabrication temperature to "force" the crystal lattice to out-diffuse point defects (vacancies and impurities) whose concentration is above the solubility limit determined by the furnace temperature. The functionally infinite source of phosphorus for diffusion is important for two reasons: first, high concentrations of diffused phosphorus stress the crystal lattice beyond its elastic limit to form fresh dislocations. These fresh dislocations have large strain fields which attract (Cottrell model) impurities. Second, high concentrations of diffused phosphorus attract impurities which prefer to form an impurity-impurity complex with phosphorus. It has been found that most metals and carbon are drawn to the phosphorus getter regions. The chemical etching step serves to remove the undesired portions from the front and back wafer faces in a manner which is not affected by variations in wafer thickness. For best results, the chemical etching solution must satisfy the following conditions: first, the solution must exhibit non-preferential etching abilities, that is, crystal defects and impurity diffused regions should be chemically removed at a rate typical of strain-free non-diffused semiconductor material; second, the etching solution should not contribute to strain-film formation; and third, the solution should have an etching rate near 12 microns per wafer side per minute.

An advantage of this process is that regions of the wafers which have P/N junctions, epitaxial films, and impurities of type or concentration which are not present in the as-sawed wafers, are chemically removed such that product yields of semiconductors formed with the reclaimed wafers are increased.

Another advantage of the process is that excess vacancies and most impurities within the wafer structure are caused to diffuse to favored sites for annihilation away from electrically active regions of a circuit. Such annihilation occurs by impurity – impurity capture and by impurity lattice defect "Cottrell" capture.

Still another advantage of this invention is that it provides a technique for annihilating excess vacancies in a semiconductor wafer such that the wafer is near equilibrium during the subsequent fabrication of a semiconductor product.

Other objects and advantages will be apparent to those skilled in the art after having read the following detailed disclosure which makes reference to the several figures of the drawing.

IN THE DRAWING

DETAILED DESCRIPTION OF THE PREFERRED EMBODIMENTS

Figure 1:
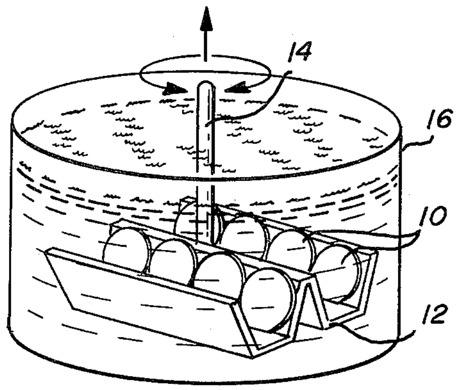
FIG. 1 is a diagrammatic perspective view of a boat carrying a plurality of semiconductor wafers which is immersed in an etching solution in accordance with the present invention.
Figure 2:
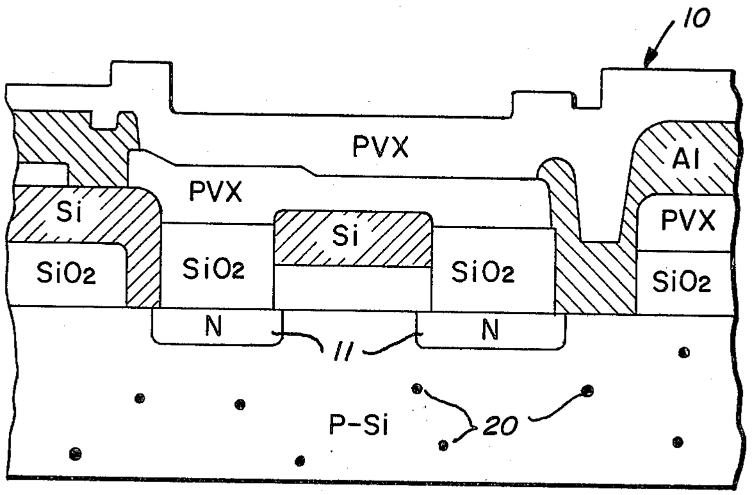
FIG. 2 is an elevational cross-sectional view of a semiconductor wafer including several external conducting and insulating layers as the wafer is received prior to the reclaiming process of the present invention.

Semiconductor wafers are generally shipped to a wafer reclaiming company just as they were withdrawn from a production line. Referring now to FIGS. 1 and 2 of the drawing, a semiconductor wafer 10, which is the subject of the reclamation, is illustrated. As shown therein, the wafer 10 has a P-type conductivity with N-type conductivity regions 11, and includes external layers of silicon dioxide ($SiO_2$), polycrystalline silicon (Si), aluminum (Al), and phospho vapox (PVX). In addition, the wafer may include layers of phosphosilicate glass (PSG) and silicon nitride ($Si_3N_4$) (not shown). Silicon wafers containing gold should not be reclaimed. Although an MOS structure is illustrated, it should be recognized that bipolar structures may also be reclaimed by the described process.

In accordance with this invention, as illustrated in FIG. 1, the wafers 10 are placed into a wafer boat 12 having a handle 14. The boat 12 is then lowered by its handle 14 into a container 16, which comprises appropriate solutions as will be subsequently described, and agitated slightly.

The first step in reclaiming semiconductor, or silicon, wafers consists of chemically removing the oxides, metals, nitrides, polysilicon, photo-resist and other materials from the silicon wafer so as to produce a stripped wafer. In this step, the wafer is appropriately immersed in several containers, each container 16 including a different solution. For example, in removing the outer layers of the wafer shown in FIG. 2, sulfuric acid is used to remove the organic materials, a mixture of hydrochloric and nitric acid is used to remove metals, and hydrofluoric acid would be used to remove the oxides and nitrides. In addition, the wafer may be placed in standard silicon etches to remove top layers of polycrystalline silicon.

Figure 3:
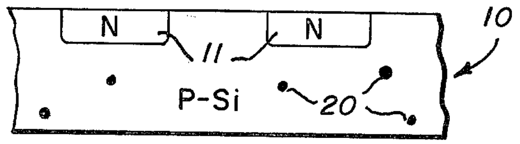
FIG. 3 is a view similar to FIG. 2 after the external layers have been stripped away from the front face of the wafer illustrating the contaminants present within the wafer body.

Within the stripped wafer, as illustrated in FIG. 3, many contaminants 20 are embedded. Common contaminants may include oxygen, carbon and metals such as copper, as well as impurities which were intentionally introduced into the wafer after crystal growth, such as boron, phosphorus, antimony, or arsenic. These contaminants may be particularly deleterious to device performance.

Figure 4:
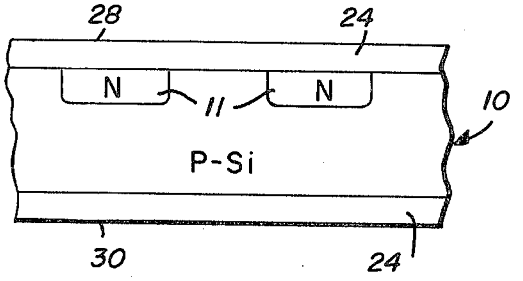
FIG. 4 is a view similar to FIG. 3 after the step of gettering has diffused a thin layer of phosphorus into the outer surfaces of the wafer in accordance with the present invention.

In order to remove most of the contaminants 20, a gettering step is thereafter performed. In this step, the wafer boat 12 containing the stripped wafers is slowly moved through a furnace having a temperature in the range between 850°C and 1150°C. Preferably, a temperature of 1040°C ± 50°C is used. When the temperature of the wafers is approximately that of the furnace, a phosphorus impurity is carried in a gas stream to the wafers whereupon the phosphorus is diffused into the surfaces of the wafer. The source of the phosphorus should be functionally infinite and is preferably $P_2O_5$, although $POCl_3$ or $PH_3$ may also be used as a source of phosphorus. At room temperature, $P_2O_5$ is solid, so heat is required to form it into a vapor. As the $P_2O_5$ begins to vaporize, it is carried by a carrier gas, such as nitrogen into the high temperature zone of the furnace. The furnace is set up such that the nearly infinite source of the phosphorus diffusant is assured throughout the furnace cycle. Accordingly, the phosphorus is diffused at a very high concentration to a depth of about 2 microns into the semiconductor wafer. With reference to FIG. 4, the diffused phosphorus is illustrated by the numeral 24.

After a specified time, the wafers are withdrawn and the diffusant source is removed. Then the wafers are pulled into a cool zone and allowed to cool to a temperature suitable for handling.

In the gettering operation, the furnace temperature is selected at or slightly below the normal semiconductor device fabrication temperature to "force" the crystal lattice to out-diffuse point defects (vacancies and impurities) whose concentration is above the solubility limit determined by the furnace temperature.

Accordingly, the point defects within the wafer are caused to move to the front and back faces 28 and 30, respectively, of the wafer. The phosphorus which is diffused into the wafer causes a strain to be generated on the wafer surfaces 28 and 30 that attracts contaminant impurities from within the wafer lattice. Consequently, most of the excess vacancies and contaminant impurities within the wafer are caused to form on the front and back faces.

Figure 5:
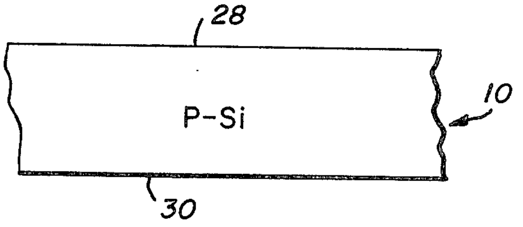
FIG. 5 is a view similar to FIG. 4 after the outer impurity-containing surfaces of the wafer have been removed by chemical etching in accordance with the present invention.

Referring now to FIG. 5, after the completion of the gettering operation the boat 12 carrying the cooled gettered semiconductor wafers is immersed in a container 16 containing a silicon etchant. Preferably, the etchant comprises hydrofluoric acid, nitric acid, acetic acid, and iodine in accordance with the following formula:

1ml HF: 3ml $HNO_3$: 4ml (Acetic Acid : 8.8mg Iodine).

This etchant provides a constant etching rate of 12 microns per minute per side at 25°C. While the wafer boat is immersed in the etchant, agitation of either the boat or the container should be used since agitation provides a near planar removal of silicon. It has been found that etching solutions that remove silicon at a constant rate irregardless of the impurity type, impurity concentration, crystaline orientation, and lattice strain, as well as to retard the formation of strain films during acid-to-water quenching are desirable. Other etchants that have been found suitable for use in this step include the following:

| Composition (all concentrated acids) | | | Etching Rate (at 25°C) |
|---|---|---|---|
| 2ml HF: | 10 ml $HNO_3$ (CP-6) | | 15μ/min/side |
| 4ml HF: | 10 ml $HNO_3$ | | 25μ/min/side |
| 6ml HF: | 10 ml $HNO_3$ (CP-8) | | 52μ/min/side |
| 1ml HF: | 5 ml $HNO_3$ : 3ml | (Acetic Acid) | 16μ/min/side |
| 2ml HF: | 5 ml $HNO_3$ :15ml | (Acetic Acid) | 7μ/min/side |
| 1ml HF: | 3 ml $HNO_3$ : 8ml | (Acetic Acid: 4.4 ml Iodine) | 8μ/min/side |

Generally, the wafer is immersed in the etchant for about 20 seconds which removes 0.5 mils ± .2 mils from the original wafer surfaces. Consequently, 0.3 to 0.7 mils are typically removed from the wafer during the etching step. However, it is preferable to know the depth of the initial diffusion in the semiconductor product to assure that all of the P/N junctions and impurities are removed from the front and back faces. In viewing the etched wafer, a faint image of the prior semiconductor product is sometimes visible since depressions exist where the impurities were removed.

Following the etching operation the thickness of each of the wafers is measured, and the wafers are separated into groups having variations in thickness of 0.1 mils.

Thereafter, if higher quality reclaim wafers are desired, the back face of the wafer is ground so as to generate a massive source of dislocations. These dislocations tend to attract impurities within the wafer. The dislocations are on the back face which has little or no influence on the performance of the semiconductor product, subsequent product yields are increased.

After grinding, the front face is chemical-mechanically polished with a wafer polisher, such as that manufactured by the Siltec Corporation. In this chemical-mechanical polishing step, the temperature, pressure and slurry flow rate are all controlled through appropriate adjustments of the polisher so as to remove about 1 mil of silicon from the front face. The polished wafer is then immersed in appropriate baths to remove residual amounts of the slurry or other films.

Although this invention has been described using silicon technology, one skilled in the art should recognize that the process may be utilized in reclaiming other semiconductor materials such as germanium. In addition, it should be recognized that this invention is directed toward a novel process for reclaiming a semiconductor wafer which includes a gettering step followed by an etching step. With this sequence of steps reclaim wafers are provided with a greater purity than have virgin wafers. The individual steps which make up this novel process are not in themselves new. However, their application in combination to totally remove, not just redistribute, undesired impurities prior to circuit processing is both new and novel.

From the above, it will be seen that there has been provided a preferred process for reclaiming semiconductor wafers which fulfills all of the objects and advantages set forth above.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A method of reclaiming a semiconductor wafer comprising the steps of:

stripping all external layers from said wafer;

gettering said wafer so as to draw excess point defects towards the surfaces of said wafer; and etching the surfaces of said wafer so as to effectively remove the contaminants that were drawn toward said wafer surfaces.

2. A method of reclaiming a semiconductor wafer as recited in claim 1 including following termination of the etching step the step of grinding one face of the wafer so as to generate a massive source of surface lattice strain.

3. A method of reclaiming a semiconductor wafer as recited in claim 2 including the step of polishing the other face of said wafer.

4. A method of reclaiming a semiconductor wafer as recited in claim 1 wherein the step of stripping includes the steps of placing said wafer in a boat and immersing said boat in baths consisting of sulphuric acid to remove organic material, hydrochloric acid and nitric acid to remove metallic materials, and hydrofluoric acid to remove oxides and nitrides.

5. A method of reclaiming a semiconductor wafer as recited in claim 1 wherein the step of gettering includes the substeps of heating said wafer to a temperature below the melting temperature of said semiconductor material such that excess point defects within said wafer are caused to move toward said surfaces and forming a layer of phosphorus over said surfaces thereby generating a strain and causing said impurities to form near said surfaces.

6. A method of reclaiming a semiconductor wafer as recited in claim 5 wherein during said heating sub-step said wafer is heated to a temperature in the range of between 850°C and 1150°C.

7. A method of reclaiming a semiconductor wafer as recited in claim 5 wherein the step of forming a layer of phosphorus includes directing a stream of a gaseous phosphorus compound over said surfaces until a high concentration of phosphorus is diffused to a depth of about 2 microns into said wafer.

8. A method of reclaiming a semiconductor wafer as recited in claim 1 wherein the step of etching removes at least 0.1 mil from each of said surfaces.

9. A method of reclaiming a semiconductor wafer as recited in claim 1 wherein the step of etching includes placing said wafer in a liquid comprising a concentrated acid which has a characteristic etching rate of about 12 microns/minute/side at 25°C.

10. A method of reclaiming a semiconductor wafer as recited in claim 1 wherein the step of etching includes placing said wafer in a liquid comprising 1 part of hydrofluoric acid, 3 parts of nitric acid, 4 parts of a mixture of acetic acid, and iodine.

11. A method of reclaiming a semiconductor wafer as recited in claim 1 including the steps of measuring the thickness of said etched wafers, separating said measured wafers into groups having a 0.1 mil thickness variation, and polishing the other face of said wafer.

* * * * *